United States Patent
Nakagawa et al.

(10) Patent No.: US 7,913,126 B2
(45) Date of Patent: Mar. 22, 2011

(54) SEMICONDUCTOR MEMORY DEVICE AND METHOD OF TESTING SAME

(75) Inventors: Hiroshi Nakagawa, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 607 days.

(21) Appl. No.: 11/976,652

(22) Filed: Oct. 26, 2007

(65) Prior Publication Data

US 2008/0101142 A1    May 1, 2008

(30) Foreign Application Priority Data

Oct. 27, 2006    (JP) .................................. 2006-292530

(51) Int. Cl.
*G11C 29/00* (2006.01)
(52) U.S. Cl. ........................ 714/710; 714/718
(58) Field of Classification Search ............... 714/42, 714/719, 718, 710, 723, 733
See application file for complete search history.

(56) References Cited

U.S. PATENT DOCUMENTS

| | | | |
|---|---|---|---|
| 6,530,040 B1 * | 3/2003 | Gradinariu et al. ............. | 714/42 |
| 7,137,049 B2 * | 11/2006 | Hoffmann et al. ............. | 714/719 |
| 7,152,192 B2 * | 12/2006 | Brummel et al. ............. | 714/718 |
| 7,240,253 B2 | 7/2007 | Yoshida et al. | |
| 7,490,274 B2 * | 2/2009 | Hoffmann et al. ............. | 714/710 |
| 2001/0042231 A1 * | 11/2001 | Kawamata .................... | 714/719 |

FOREIGN PATENT DOCUMENTS

JP    58-155599       9/1983
JP    2004-310918 A   11/2004

* cited by examiner

*Primary Examiner* — David Ton
(74) *Attorney, Agent, or Firm* — Foley & Lardner LLP (57) ABSTRACT

Provided is a semiconductor memory device in which it is possible to conduct a parallel test by comparison with an expected value after replacement with a redundant cell. The memory device includes a logic circuit for outputting an activated redundant hit signal when at least one determination circuit of determination circuits corresponding to respective ones of a plurality of redundant addresses is activated; a logic circuit for outputting an activated signal when all outputs of the circuits are inactive; and a selector for outputting a test-result mask signal when a redundant area is tested, and outputting the output of the logic circuit when a normal area is tested. The test result is forcibly passed when a memory array is tested and when a redundant address is accessed.

17 Claims, 4 Drawing Sheets

SEMICONDUCTOR MEMORY DEVICE AND METHOD OF TESTING SAME

REFERENCE TO RELATED APPLICATION

The present application is claiming the priority of the earlier Japanese patent application No. 2006-292530 filed on Oct. 27, 2006, the entire disclosure thereof being incorporated herein by reference thereto.

FIELD OF THE INVENTION

This invention relates to a semiconductor memory device and to a method of testing the device. More particularly, the invention relates to a semiconductor memory device having a configuration suited for a test carried out after the replacement of a fail cell with a redundancy cell, and to a method of testing the device.

BACKGROUND OF THE INVENTION

In semiconductor memory devices, there has been adopted an arrangement in which a redundant area for redundant cells is provided separate from a memory area for normal cells. The semiconductor memory device in which a defective cell has been detected is remedied by replacing the defective cell (fail cell) with a redundant cell based upon fail information obtained by conducting a wafer test, etc. By way of example, the correspondence between the address of a fail cell and a redundant address is set based upon whether or not a fuse is blown. If a memory cell to be accessed is a fail cell, the replacement of which with a redundant cell has been made, the redundant cell that is selected by a redundant address is accessed in place of the fail cell.

The unit of the replacement of a fail cell with a redundant cell (termed redundant replacement) has become smaller in recent years (e.g., redundant replacement is now performed in units of single word lines and 2-bit line pairs, etc.). As a result, in a case where the influence of physical data of an adjacent word line or adjacent bit line should be taken into account in a device that has a fail cell replaced with a redundant cell, the importance of a test that writes and reads certain physical data over the entirety of the chip is growing. For example, in a dynamic memory in which one cell comprises one transistor and one capacitor, after data that sets the terminal voltage of the cell capacitor to a high potential (also referred to as "cell-high data") has been written to the memory, the data of this cell is read out and compared with an expected value.

In this case, when a redundant word line or redundant bit line is accessed in a device which has a fail cell remedied by replacing the fail cell with a redundant cell, the number of the redundant line that is selected cannot be determined and which logical data has been read out cannot be determined. This can cause problems.

An expected-value comparing-type parallel test has been proposed heretofore in order to improve the rate of fail-bit detection and improve testability. With an ordinary parallel test, items of data that have been read out of a memory cell are compared with each other. The expected-value comparing-type parallel test, however, compares the data with expected-value data that has been written to a register.

In this specification, the term "parallel test" refers to a test mode in which a plurality of memory cells are tested at one time on a selected word line, although there is no particular limitation. The scope of the parallel test spans a plurality of columns, e.g., 16 I/O bits [the 16 columns are 4-bit data in each of four banks in the case of DDR (Double Data Rate)].

As an example of an expected-value comparing-type parallel test, Patent Document 1 discloses an arrangement having a holding circuit for holding write data to a memory cell of a memory array, the write data from the holding circuit being written to the memory cell of a selected address; a comparator to which the data read out of the memory cell is input and to which the data held in the holding circuit is input as expected-value data, an non-inverted value or inverted value of the write data held in the holding circuit being output as write data to the memory cell and expected-value data to the comparator in accordance with the value of an inversion control signal; and a discriminating circuit for outputting an error flag based upon a match detection signal connected to a plurality of the comparators.

[Patent Document 1] Japanese Patent Kokai Publication No. JP-P2004-310918A

The following analysis is given by the present invention. The disclosure of the above-mentioned Patent Document 1 is herein incorporated by reference thereto.

A problem with the expected-value comparing-type parallel test is that the expected value is unknown in a case where the target of the test is an I/O bus of an ordinary memory array that is not a redundant cell. For example, in a case where a certain value is selected as an X address (row address) and reading is performed upon successively scanning column addresses in an amount of, e.g., eight columns (e.g., "LLHHLLHH", where "H" represents high and "L" represents low) after cell-high data has been written in its entirety, and in a case where another value is selected as an X address and reading is performed upon successively scanning column addresses in an amount of, e.g., eight columns (e.g., "HLLHHLLH"), the patterns of the read data values will be different from each other. That is, when a memory cell is replaced with a redundant cell, what number redundant word line and redundant bit line used as the replacement line is arbitrarily determined. Consequently, the expected values of a plurality of memory cells to which cell-high data has been written will be unknown. In an expected-value comparing-type parallel test, therefore, if parallel data relating to separate X addresses is compared with the same expected value, a "fail" result will be obtained and the test cannot be conducted normally.

SUMMARY OF THE DISCLOSURE

The present invention has been devised based upon recognition of the above-mentioned problems. It is an object of the present invention to provide a semiconductor memory device, which has redundant cells, in which it is possible to conduct an expected-value comparison test, and a method of testing the device.

According to an aspect of the present invention, there is provided a semiconductor memory device for reading data out of a memory cell written at a prescribed potential and comparing the data with an expected value to conduct a test, the device including a circuit for determining whether a memory cell undergoing test has been replaced with a redundant cell and forcibly setting test result to "pass" (a value indicative of "pass") if the memory cell has been replaced with a redundant cell.

A semiconductor memory device according to the present invention comprises: a first circuit for comparing, when a memory array is tested, read-out data from a memory cell to which data that sets the memory cell to a prescribed potential has been written and an expected value comprising write data that places the memory cell at the prescribed potential, and outputting "pass" or "fail" as test result based upon result of the comparison; and a second circuit for forcibly setting test result to "pass" if a memory cell under test has been replaced with a redundant cell.

In the semiconductor memory device according to the present invention, after data of a value that sets a plurality of memory cells under test to the prescribed potential in common has been written to respective ones of the plurality of cells, the first circuit compares a plurality of items of read-out data from the plurality of memory cells and an expected value comprising a plurality of items of write data that set the plurality of memory cells to the prescribed potential in common, and compresses the test result to a 1-bit pass/fail signal based upon whether or not there is a match in a plurality of results of comparison between read-out data and the expected value relating to the plurality of memory cells; and the second circuit forcibly sets the value of the 1-bit pass/fail signal to a value indicative of "pass" if a memory cell under test has been replaced with the redundant cell.

The semiconductor memory device according to the present invention further comprises a determination circuit for determining whether an access address has been replaced with a redundant address, wherein the second circuit forcibly sets the test result to "pass" at the time of the test if it is determined based upon the result of determination by the determination circuit that the access address has been replaced with the redundant address.

In the semiconductor memory device according to the present invention, it is preferred that a test of the memory array based upon comparison with an expected value and a test of the redundant area be conducted separately.

At the time of normal operation and at the time of testing of a memory array in the semiconductor memory device according to the present invention, if it is determined based upon the result of determination by the determination circuit that the access address has been replaced with the redundant address, then a redundant cell selected by the redundant address is accessed, and if it is determined based upon the result of determination by the determination circuit that the access address has not been replaced with the redundant address, then a normal cell is accessed by the access address; and in testing the redundant area, accessing of a redundant cell is performed by a redundant address selected by a redundancy selection signal obtained by decoding a prescribed bit field of an access address.

The semiconductor memory device according to the present invention further comprises a circuit for storing and holding information, which indicates whether a redundant address is being used in redundant replacement of a fail cell, in regard to each redundant address; and a circuit which, in testing the redundant area, is for exercising control in such a manner that test result is forcibly made "pass" if all of the redundant addresses are unused, and such that the result of a test relating to a selected redundant cell is output if a redundant address that is being used has been selected.

At the time of testing of the redundant area in the semiconductor memory device according to the present invention, after each item of data of a value that sets a plurality of redundant cells to the prescribed potential in common has been written, read-out data from the plurality of redundant cells and an expected value comprising a plurality of items of write data that set the plurality of redundant cells to the prescribed potential in common are compared, and the test result is output upon being compressed to a 1-bit pass/fail signal based upon whether or not there is a match in a plurality of results of comparison relating to the plurality of redundant cells.

In a semiconductor memory device according to the present invention, data of value that sets a plurality of memory cells under test to a prescribed potential in common is written to respective ones of the plurality of memory cells when a memory array is tested, the device comprising a first circuit for comparing in parallel a plurality of items of read-out data from the plurality of memory cells and an expected value comprising a plurality of items of write data that set the plurality of memory cells to the prescribed potential, and outputting the test result upon compressing it to a 1-bit pass/fail signal based upon whether or not there is a match in a plurality of results of comparison relating to the plurality of memory cells; and a second circuit for forcibly setting the test result to "pass" if a memory cell under test has been replaced with a redundant cell; wherein the parallel test of the memory array based upon comparison with an expected value is performed separate from the test of the redundant area.

The semiconductor memory device according to the present invention further comprises a determination circuit provided in correspondence with each redundant address for determining whether an access address has been replaced with a redundant address and outputting an activated signal when an access address has been replaced with a redundant address; and a logic circuit, to which outputs of the determination circuits of respective ones of the plurality of redundant addresses are input, for activating and outputting a signal, which masks the test result, when at least one output has been activated; wherein the second circuit receives the test result and the test-result mask signal as inputs and forcibly sets the test result to a "pass" value when at least one of the outputs is activated Alternatively, the semiconductor memory device according to the present invention further comprises the following in correspondence with each redundant address:

a storage unit that stores, as an enable signal, information indicating whether the redundant address is being used in redundant replacement of a fail cell;

a determination circuit that determines whether an access address has been replaced with a redundant address and outputting an activated signal when an access address has been replaced with a redundant address; and a first logic circuit that outputs an activated output signal if the enable signal and a redundancy selection signal obtained by decoding a prescribed bit field of an access address both are activated.

The semiconductor memory device further comprises:

a second logic circuit that receives as inputs the output signals of said respective first logic circuits of the plurality of redundant addresses, and outputs an activated signal when the plurality of first logic circuits are all inactive;

a third logic circuit that receives as inputs the output signals of said respective determination circuits of the plurality of redundant addresses, and outputs an activated redundant-hit signal when at least one of the output signals is activated; and a selector that receives as inputs the output signals of said second and third logic circuits, and outputs the output signal of said third logic circuit as a test-result mask signal, when the memory array is tested, and outputs the output signal of said second logic circuit as a test-result mask signal when a redundant area is tested;

wherein said second circuit receives as inputs the 1-bit pass/fail signals from said first circuits and the test-result mask signal from said selector and forcibly outputs a value indicative of pass when the test-result mask signal is active.

The semiconductor memory device according to the present invention further comprises a second selector for exercising changeover control in such a manner that if it is determined based upon the result of determination by the determination circuit that the access address has been replaced with a redundant address at the time of normal operation and in testing a memory array, then the redundant cell selected by the redundant address is accessed, and such that in testing the redundant area, accessing of a redundant cell is performed by a redundant address selected by a redundancy selection signal obtained by decoding a prescribed bit field of an access address.

A method of testing a semiconductor memory device according to the present invention comprises the steps of: reading data out of a memory cell written at a prescribed potential, comparing the data with a corresponding expected value and outputting test result; and determining whether a memory cell under test has been replaced with a redundant cell and forcibly setting test result from the first-mentioned step to "pass" if the memory cell has been replaced with a redundant cell.

A method of testing a semiconductor memory device according to the present invention comprises the steps of: writing data of a value that sets a plurality of memory cells under test to a prescribed potential in common to respective ones of the plurality of memory cells when a memory array is tested; comparing in parallel a plurality of items of read-out data from the plurality of memory cells and an expected value comprising write data of value that sets the plurality of memory cells to the prescribed potential, and outputting the test result upon compressing it to a 1-bit pass/fail signal based upon whether or not there is a match in a plurality of results of comparison relating to the plurality of memory cells; and forcibly setting the test result to "pass" if a memory cell under test has been replaced with a redundant cell; wherein the parallel test of the memory array based upon comparison with an expected value is performed separate from the test of the redundant area.

The meritorious effects of the present invention are summarized as follows.

In accordance with the present invention, it is possible to implement an expected-value comparison-type parallel test of a device after replacement by a redundant cell.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

The present invention will be described in detail with reference to the accompanying drawings. When a memory array is tested in the semiconductor memory device according to the present invention, write data having a value that sets a plurality of memory cells under test to a prescribed potential in common is written to respective ones of the plurality of cells. The semiconductor memory device includes a first circuit (31, 32 in FIG. 3) for comparing, in parallel, a plurality of items of read-out data from the plurality of memory cells with expected values comprising a plurality of items of write data that set the plurality of memory cells to the prescribed potential, and outputting a 1-bit pass/fail signal as a test result (CERR256) based upon whether or not there is a match in a plurality of results of comparison (between the read-out data and expected value) relating to the plurality of memory cells; and a second circuit (33) for forcibly setting the test result to "pass" based upon a rest-result mask signal (CTCMPPASS) if a memory cell under test has been replaced with a redundant cell. In the present invention, the parallel test of the memory array based upon comparison with the expected value is carried out separate from a test of a redundant area.

The semiconductor memory device of the present invention has a redundant circuit (BCRED) provided in correspondence with each of a plurality of redundant addresses (e.g., redundant columns). The redundant circuit includes a storage unit (101) for storing, as an enable signal, information indicating whether the redundant address is being used in redundant replacement of a fail cell; a determination circuit (102, 103, 105) for determining whether an access address has been replaced with a redundant address and outputting an activated signal when an access address has been replaced with a redundant address; and a first logic circuit (104) for outputting an activated output signal if the enable signal and a redundancy selection signal (CTRATY) obtained by decoding a prescribed bit field of an access address both are activated.

The semiconductor memory device further includes a second logic circuit (11) for receiving as an input the output of the first logic circuit (104) of each of the plurality of redundant circuits (BCRED in FIG. 1) and outputting an activated signal (CFTCUT_B) when the plurality of first logic circuits (104) are all inactive; a third logic circuit (12) for receiving as an input the output of the determination circuit (105) of each of the plurality of redundant addresses and outputting an activated redundant hit signal (CYROR) when at least one of the output signals of the plurality of determination circuits (105) has been activated; and a selector (14) for receiving as inputs the output signal of the second logic circuit (11) and the output signal of the third logic circuit, outputting the output signal of the third logic circuit (12) as a test-result mask signal when the memory array is tested, and outputting the output signal of the second logic circuit (11) when a redundant area is tested.

Figure 1:
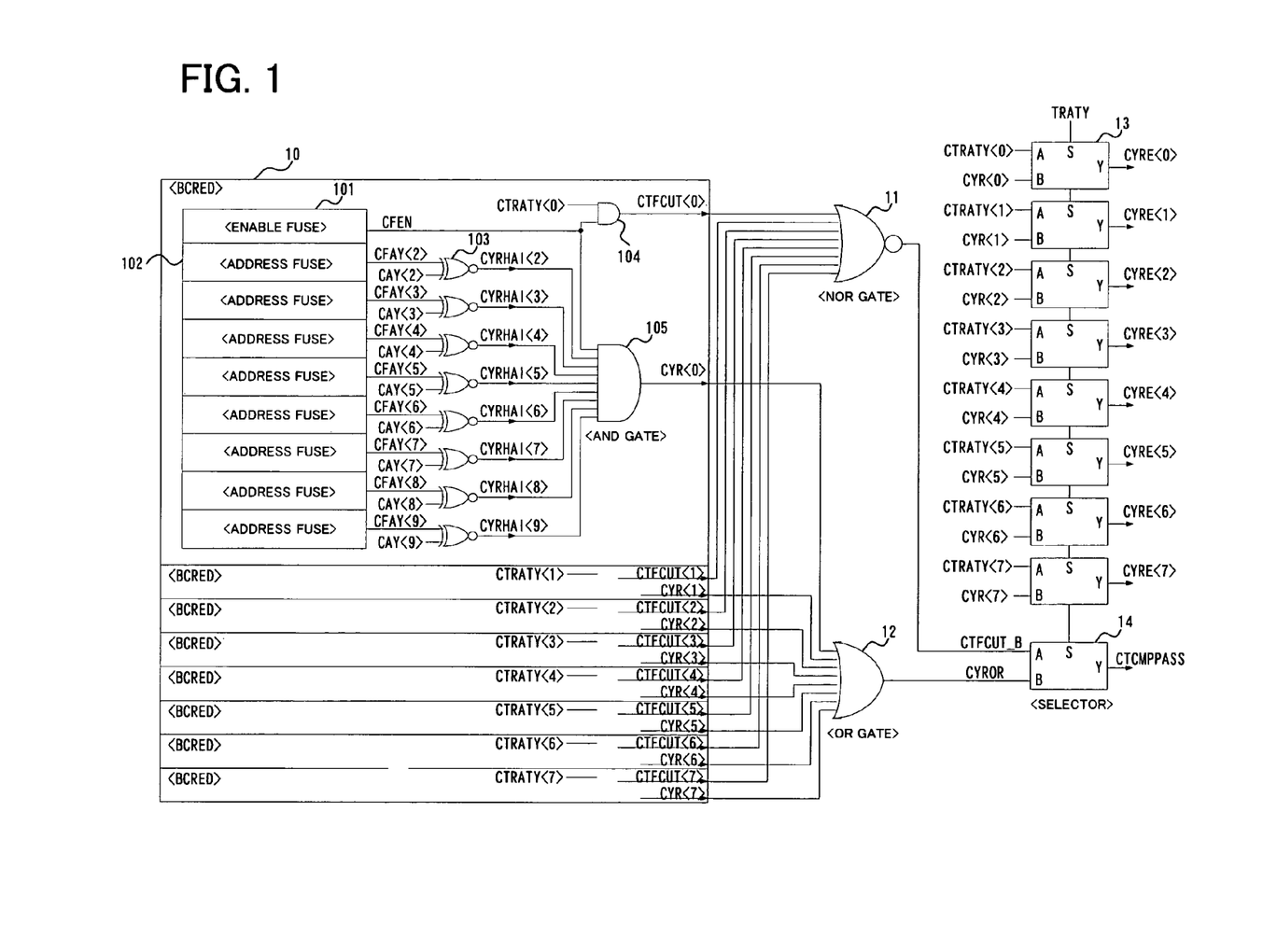
FIG. 1 is a diagram illustrating the configuration of a column redundancy circuit according to an example of the present invention.
Figure 3:
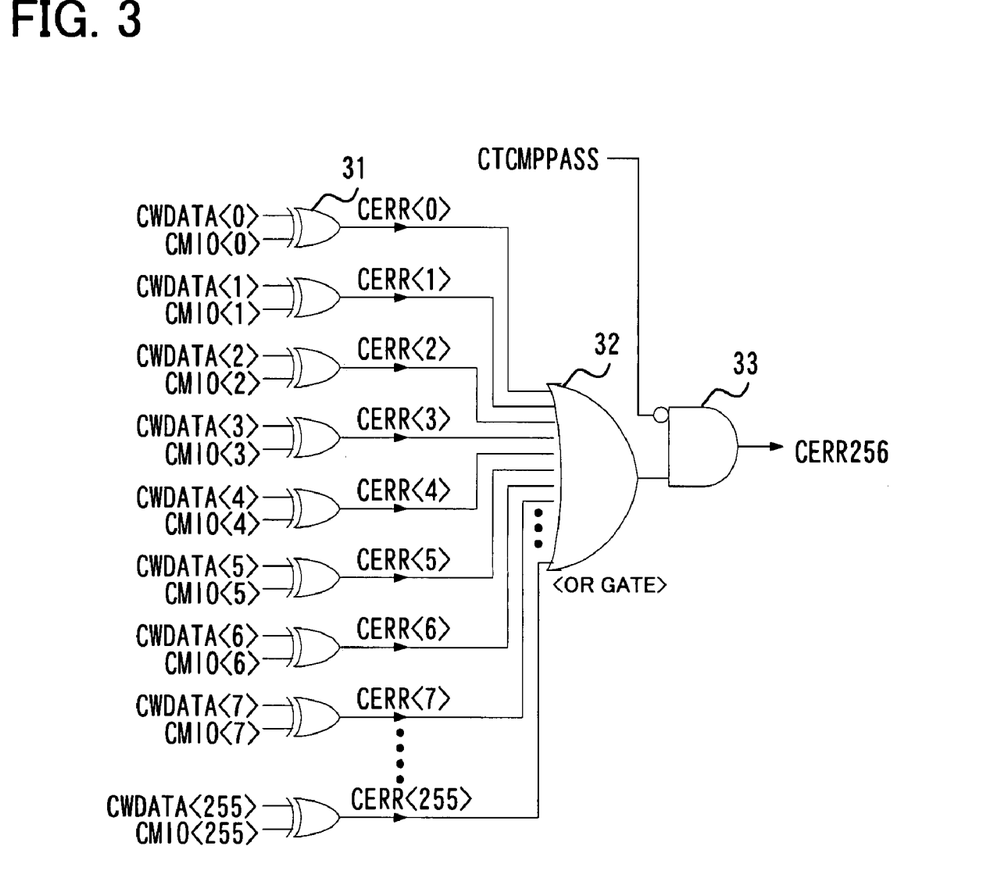
FIG. 3 is a diagram illustrating the configuration of a parallel-test compression circuit according to an example of the present invention.

The second circuit (33) receives as inputs the 1-bit pass/fail signal from the first circuit (32) and the test-result mask signal from the selector circuit 14 and forcibly outputs a "pass" value when the test-result mask signal is in the active state.

In the present invention, the semiconductor memory device further includes a selector (13) for receiving a signal (CYR<i>) from the determination circuit (105) and the redundancy selection signal (CTRATY<i>) obtained by decoding part of the address signal. The selector 13 uses the redundancy selection signal (CTRATY<i>) as a redundant-area select signal when a redundant area is tested, and uses the signal (CYR<i>) from the determination circuit as the redundant-area select signal at the time of normal operation and when a memory area is tested. Testing of a redundant area also is performed in a manner similar to the normal memory array by an expected-value comparison-type parallel test.

In accordance with the present invention, when a parallel test is conducted, the test is divided into a test of a normal cell array and a test of a redundant cell array. With regard to ordinary address access in which redundant replacement has not been performed, the parallel test is conducted in the ordinary manner. If an address that has undergone redundant replacement (the expected value is unknown) is accessed, the test results of a plurality of cells that have undergone redundant replacement are forcibly set to "pass". This makes it possible to implement an expected-value comparison-type parallel test of a device that has undergone replacement by a redundant cell.

In accordance with the present invention, only a redundant address being used is tested in the test of a redundant area. When a redundant line not in use is accessed, the line is forcibly set to "pass".

The present invention is such that in a case where both a row (X address) and column (column address) are not addresses that have been replaced with redundant addresses, a plural-bit (e.g., 256-bit) parallel test is conducted as usual. That is, write data is held in a register as an expected value, and parallel data, which is obtained by successively scanning and reading out column addresses, e.g., 16 addresses, in relation to a certain selected word line is compared with the expected value. Although there is no particular limitation, a parallel test of 4-bit data in each of four banks (16×4×4=256) is a 256-bit parallel test with regard to each I/O of 16 I/O's according to DDR (Double Date Rate) specifications.

If either or both of a row (X address) and column (column address) corresponds to an address that has been replaced with a redundant address, the result of comparison in the unit of rescue is forcibly passed utilizing a redundant hit signal that is activated. For example, a 64-bit or 32-bit compressed result, which is a unit of rescue, is passed. A test of the remaining 192 bits or 224 bits is conducted by an expected-value comparison-type parallel test.

An area that has been forcibly passed and has not undergone a test is subjected to a test by a redundant area test. In the redundant area test, the redundant line (row, column) selected is known and therefore the problem of an unknown expected value does not arise.

Further, in accordance with the present invention, in the test of a redundant area, it is so arranged that on the basis of information of a storage device (enable fuse) that specifies whether an area accessed by a redundant address is being used in rescue of a fail cell, only a redundant word line or redundant bit line actually being used is tested among the redundant areas. An area for which an enable fuse has blown, i.e., a redundant cell accessed by an unused redundant address, is forcibly passed.

FIG. 1 illustrates a column-channel redundant circuit as an example of the present invention. As shown in FIG. 1, BCRED represents a column-address redundant circuit provided for each of eight redundant columns (YS0 to YS7), not shown. Thus, there are eight of these redundant circuits in all. FIG. 1 illustrates the detailed configuration of the redundant circuit (BCRED) 10 of the first redundant column; the details of the redundant circuits (BCRED) 10 of the other redundant columns are not shown.

In the redundant circuit (BCRED) 10 of the first redundant column, CAY(i) (i=2 to 9) represents a column address. Although there is no particular limitation, a column address is assumed to consist of ten bits, and the three bits from the LSB (Least Significant Bit) are used to select eight redundant columns (not shown).

An output CFAY(i) (i=2 to 9) from an address fuse 102 indicates a column address that has undergone redundant replacement with the redundant column of the applicable BCRED. In a case where the column address of a fail cell has been replaced with the redundant column corresponding to the applicable BCRED, the address fuse 102 is blown at the time of the redundant replacement and the bits 2 to 9 of the defective column address are set to CFAY<i> (i=2 to 9).

A signal CFEN from an enable fuse 101 is a redundant enable signal. In a case where the redundant cell of the redundant column corresponding to the applicable BCRED is being used for the remedy of a fail cell, the redundant enable signal CFEN is set to high level. That is, when redundant replacement of the redundant column has been performed, the enable fuse 101 is blown and the signal CFEN is fixed at high level. In a case where redundant replacement of the redundant column is not performed, the enable fuse 101 is not blown and the signal CFEN is fixed at low level.

In a case where a plurality of redundant cells are connected to a redundant column (bit line pair) and replacement with a redundant column has been performed, the cell of the redundant column is selected in place of the cell of the column of the normal cell area. To exercise this control, the column address CAY<i> of the access address and the address CFAY<i> (i=2 to 9) of the redundant column are compared by a coincidence detection circuit 103. A redundancy comparison result signal CYRHAI<i> (i=2 to 9), which is the output of the coincidence detection circuit 103, assumes high level when the column address CAY<i> and the redundancy comparison result signal CYRHAI<i> (i=2 to 9) coincide and assumes low level otherwise.

The redundant enable signal CFEN and the eight redundancy comparison result signals CYRHAI<i> (i=2 to 9) are applied to a 9-input AND gate 105. The output CYR<0> of the 9-input AND gate 105 assumes high level when the redundant enable signal CFEN and all of the redundancy comparison result signals CYRHAI<i> (i=2 to 9) are high. That is, the redundant hit signal CYR<0> assumes high level when the redundant area is being used and the column address CAY<i> and all of the redundant column addresses CFAY<i> (i=2 to 9) coincide. The redundant hit signal CYR<0> assumes low level when at least one of the redundant column addresses CFAY<i> does not match.

A redundant-bit OR signal CYROR, which is the output of an 8-input OR gate 12 that receives as inputs CYR<0> to CYR<7> from the redundant circuits (BCRED) 10 of the redundant columns (YS0 to YS7) (not shown), assumes high level when any redundant set of the redundant columns (YS0 to YS7) hits. The signal CFEN from the enable fuse is a redundant enable signal and assumes high level when the redundant set is being used.

TRATY represents a redundant area test mode signal. This signal goes high when a redundant area is tested. The signal TRATY assumes low level in normal operation. The signal TRATY also assumes low level when a normal area that does not include a redundant cell is tested.

CTRATY<i> (i=0 to 7) is a redundancy selection signal. This signal is obtained by decoding the three bits CAY<0> to CAYh<2> from the LSB of the column address using a decoder for TRATY (for redundant area test), described later.

An output CTFCUT<0> of a 2-input AND gate 104 that receives as inputs CTRATY<0> and CFEN assumes high level in a case where the redundant set has been selected in the redundant area test mode, i.e., when CFEN is high and CTRATY<0> is high.

An 8-input NOR gate 11 receives as inputs CTFCUT<0> to CTFCUT<7> from the redundant circuits (BCRED) 10 of the eight redundant columns and performs a NOR operation. An output CTFCUT_B from the 8-input NOR gate 11 assumes high level when all of the signals CTFCUT<0> to CTFCUT<7> are low and assumes low level when at least one of the signals CTFCUT<0> to CTFCUT<7> is high. That is, when CFEN is low or any of CTRATY<i> (i=0 to 7) is low in the eight redundant circuits (BCRED) 10, CTFCUT_B goes high. When CFEN is high and CTRATY<i> is high in any one of the eight redundant circuits (BCRED) 10, CTFCUT_B goes low.

Eight selectors 13 receive the respective redundancy selection signals CTRATY<i> (i=0 to 7) and redundant hit signals CYR<i> (i=0 to 7) at A and B signals, respectively, and receive the redundant area test mode signal TRATY as a selection control signal. When the redundant area test mode signal TRATY is high (i.e., when the redundant area test mode is in effect), the selectors 13 select the signal CTRATY<i> at the A terminal. When the redundant area test mode signal TRATY is low, the selectors 13 select the signal CYR<i> at the B terminal. The selectors 13 output the selected signals as signals CYRE<i> (i=0 to 7). When the redundant area test mode is in effect, the selectors 13 output, as the signals CYRE<i> (i=0 to 7), the redundancy selection signals CTRATY<i> (i=0 to 7) decoded by a TRATY decoder (described later), thereby turning on/off Y switches of corresponding redundant columns (activating/deactivating drivers for Y switches).

On the other hand, when the redundant area test mode signal TRATY is low (at times other than when the redundant area test mode is in effect, i.e., at the time of normal operation and when the memory cell array is tested), the selectors 13 output the redundant hit signals CYR<i> as the signals CYRE<i> (i=0 to 7), thereby turning on a Y switch of redundant column for which the value of the redundant hit signal CYR<i> is high. That is, in a case where a redundant address is hit at the time of normal operation or when a normal area is tested (TRATY=low), any one of the redundant hit signals CYR<i> assumes high level, the corresponding redundant column signal CYRE<i> is selected and the redundant cell is accessed.

A selector 14 receives CTFCUT_B and CYROR at A and B terminals, respectively, and receives the redundant area test mode signal TRATY as a selection control signal. The selector selects the signal CTFCUT_B at the A terminal and outputs this signal as a parallel-test forcible pass signal CTCMP-PASS when the redundant area test mode signal TRATY is high, and selects the signal CYROR at the B terminal and outputs this signal as the parallel-test forcible pass signal CTCMPPASS when the redundant area test mode signal TRATY is low.

The parallel-test forcible pass signal CTCMPPASS assumes high level, thereby forcibly passing the test result, in a case where a redundant address is hit when a normal area (a memory area that does not include a redundant cell) is subjected to a test scan (e.g., a selected word line is held fixed and column addresses are scanned). Further, when the redundant area test mode signal TRATY is high, the parallel-test forcible pass signal CTCMPPASS assumes high level, thereby forcibly passing the test result, in a case where the cell of the redundant column is unused (CFEN=low) and, moreover, is deselected (CTRATY<i>=low) at the time of a test scan of the redundant area (e.g., a selected word line is held fixed at redundant columns are scanned).

As mentioned above, which redundant column has been selected for redundancy repair of a defective column cannot be determined from outside the chip, and hence the expected value in a parallel test is unknown. Accordingly, in the present invention, at the time of normal operation or at the time of testing a normal area (TRATY=low), if the redundant-hit OR signal CYROR is utilized and any redundant set is hit, the parallel-test forcible pass signal CTCMPPASS is made high. The parallel-test forcible pass signal CTCMPPASS is connected to a parallel-test compression circuit, described later, and a compressed result in the unit of rescue is forcibly passed.

When the redundant area test mode is in effect (TRATY=high), it is possible to select any CYRE<i> (i=0 to 7) by the address signal CTRATY<i>) (i=0 to 7) for selection of a redundant column. This means that the problem of an unknown parallel-test expected value does not arise.

When the redundant area test mode is in effect in the present invention, the logical product is found between the redundancy selection signal CTRATY<i> (i=0 to 7) and the enable fuse signal CFEN corresponding to this signal. If a fuse set is being used, CTFCUT<i> (i=0 to 7) assumes high level. If an unused fuse set is accessed, CTFCUT<i> (i=0 to 7) goes low, i.e., CTFCUT_B goes high. At this time the selector 14 outputs the signal at A terminal as the output CTCMP-PASS. Therefore, CTCMPPASS goes high. By forcibly passing the result of compression, it is possible to test only redundant columns that are in use.

In accordance with this example, as described above, the test of a normal area and the test of a redundant area are performed separately depending upon the redundant area test mode signal TRATY (low or high), and an area that has undergone redundant replacement in a test of a normal area is forcibly passed. This makes it possible to conduct an expected-value comparison-type parallel test even in a device that has undergone replacement by a redundant cell.

Figure 2:
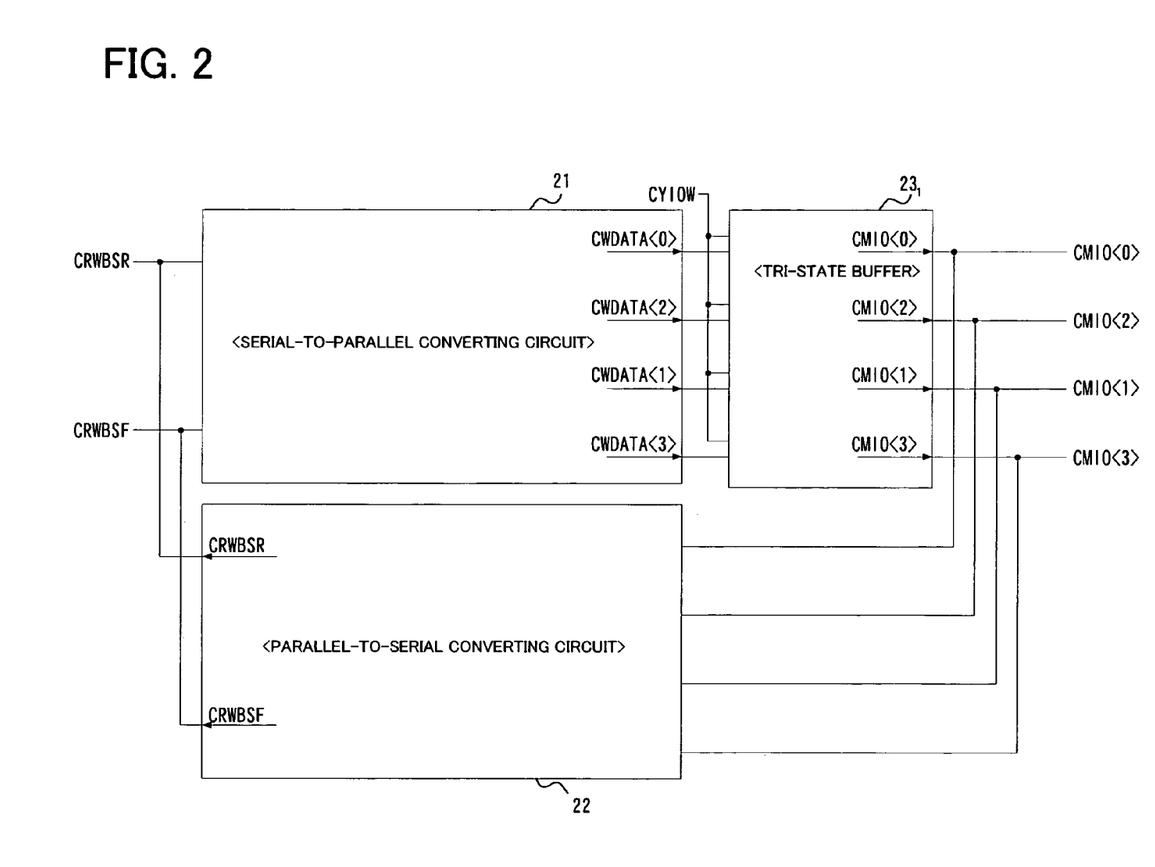
FIG. 2 is a diagram illustrating the configuration of a serial-to-parallel converting circuit according to an example of the present invention.

FIG. 2 is a diagram illustrating the configuration of an input/output circuit in an example of the present invention. FIG. 2 illustrates a circuit 21 for converting serial data to 4-bit parallel data and a circuit 22 for converting 4-bit parallel data to serial data. In this example, the serial-to-parallel converting circuit 21 functions to hold an expected value for an expected-value parallel test.

In FIG. 2, CRWBSR and CRWBSF represent read/write buses on which data sampled at the rising edges of a clock and data sampled at the falling edges of the clock, respectively, are transferred. In relation to a certain X address (selected word address held fixed), write data D0, D1 is transferred on CRWBSR and CRWBSF, respectively, at the rising and falling edges of the first clock pulse, and write data D2, D3 is transferred on CRWBSR and CRWBSF, respectively, at the rising and falling edges of the second clock pulse, in correspondence with each of column addresses Y0, Y1, Y2 and Y3.

The serial-to-parallel converting circuit 21 converts the 4-bit data D0, D1, D2 and D3 serially transferred in two clock cycles to 4-bit parallel data, holds the parallel data in a write register (not shown) and outputs the data a write-register data CWDATA<0> to CWDATA<3>. The write-register data CWDATA<0> to CWDATA<3> is held as read-out data and an expected value to be compared.

The data CWDATA<0> to CWDATA<3> is input to a tri-state buffer 23 having its outputs connected to 10 lines CMIO<0> to CMIO<3>. The tri-state buffer 23 has its outputs enabled when a write signal CYIOW is high and disabled (a state in which the output impedance is high) when the write signal CYIOW is low.

The parallel-to-serial converting circuit 22 converts the 4-bit parallel data (read data) of 10 lines CMIO<0> to CMIO<3> to serial data and outputs the serial data to the read/write buses. In relation to a certain X address (selected word address held fixed), read data D0, D1 is transferred on CRWBSR and CRWBSF, respectively, at the rising and falling edges of the first clock pulse, and read data D2, D3 is transferred on CRWBSR and CRWBSF, respectively, at the rising and falling edges of the second clock pulse, in correspondence with each of column addresses Y0, Y1, Y2 and Y3.

FIG. 3 is a diagram illustrating the configuration of a parallel-test compression circuit according to this example. Here 256-bit write-register data CWDATA<0> to CWDATA<256> and read-out data CMIO<0> to CMIO<255> of 256 IO lines are compared by respective 256 2-input exclusive-OR gates 31, which produce outputs CERR<0> to CERR<255> (high in case of non-coincidence) as the results of comparison. An OR gate 32, which receives the comparison results CERR<0> to CERR<255> from the 256 exclusive-OR gates 31, outputs the high level if even one of the comparison results CERR<0> to CERR<255> is at the high level. The output of an AND gate 33, which takes the logical product between the output of the OR gate 32 and the inverse of CTCMPPASS, is output as a test-result signal CERR256.

When CTCMPPASS is high, the test-result signal CERR256 is fixed at low level and error is masked. When CTCMPPASS is low, the output (test-result signal of the parallel test) of the OR gate 32 is output as CERR256. In the arrangement illustrated in FIG. 3, 16 columns×16 I/O bits (64 bits, four banks)=256 bits are compressed to 1-bit pass/fail information. However, the unit of compression is not limited to 256 bits and the unit of compression may be any number of bits. A parallel test based upon expected-value comparison is conducted and the parallel-test compression circuit of FIG. 3 is used also when a redundant area is tested.

Figure 4:
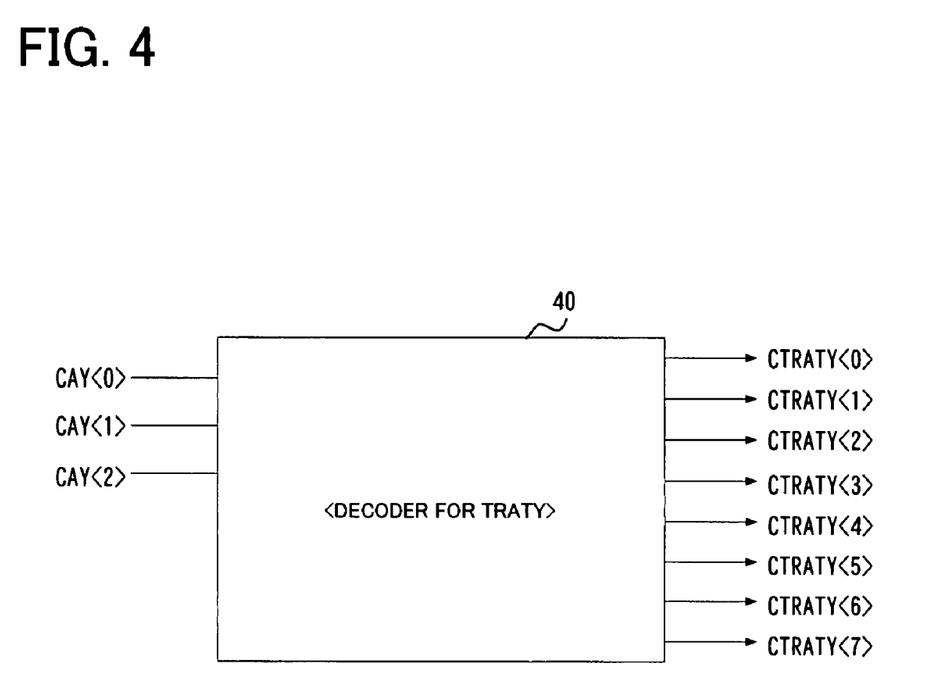
FIG. 4 is a diagram illustrating the configuration of a decoder circuit for a TRATY according to an example of the present invention.

FIG. 4 is a diagram illustrating the signal terminals of a decoder 40 for TRATY in an example of the present invention. The TRATY decoder 40 receives column addresses CAY<0> to CAY<2>) of the three lower-order bits on the LSB side as inputs, decodes these addresses and places one signal CTRATY<i> (where i is any one of 0 to 7) among the redundancy selection signals CTRATY<0> to CTRATY<7> at the high level.

In the above-described example, the configuration of a column redundant circuit of a dynamic random-access memory (DRAM) is illustrated. Naturally, however, the present invention is also applicable to an arrangement having a row-address redundant circuit. The present invention is also applicable to a semiconductor integrated circuit device incorporating an on-chip DRAM. Further, the present invention is not limited to a clock-synchronized DRAM such as a DDR SDRAM (Synchronous DRAM) and is applicable to any DRAM (inclusive of those of asynchronous type) and flash memory, etc., having redundant cells.

Though the present invention has been described in accordance with the foregoing example, the invention is not limited to these example and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device in which write data of value that sets a plurality of memory cells under test to a prescribed potential in common is written to respective ones of the plurality of memory cells when a memory array is tested, said device comprising:
a first circuit that compares in parallel a plurality of items of read-out data from the plurality of memory cells and expected values comprising a plurality of items of write data that set the plurality of memory cells to the prescribed potential, and outputs the test result upon compressing it to a 1-bit pass/fail signal based upon whether or not there is a match in a plurality of results of comparison relating to the plurality of memory cells; and
a second circuit that forcibly sets the test result relating a memory cell under test to a value indicative of pass if the memory cell under test has been replaced with a redundant cell;
wherein the parallel test of the memory array based upon comparison with an expected value is performed separate from the test of the redundant area.

2. The semiconductor memory device according to claim 1, further comprising:
a plurality of determination circuits provided in correspondence with redundant addresses, respectively, each of which determines whether an access address has been replaced with a redundant address and outputs an activated signal when an access address has been replaced with a redundant address; and
a logic circuit that receives outputs of said determination circuits of respective ones of the plurality of redundant addresses, and activates and outputs a test-result mask signal, when at least one output is activated;
wherein said second circuit receives the test result and the test-result mask signal as inputs and forcibly sets the test result to a value indicative of pass when at least one of the outputs is activated.

3. The semiconductor memory device according to claim 2, the redundant address corresponds to a redundant column and/or a redundant row.

4. The semiconductor memory device according to claim 1, further comprising the following in correspondence with each redundant address:
a storage unit that stores, as an enable signal, information indicating whether the redundant address is being used in redundant replacement of a fail cell;
a determination circuit that determines whether an access address has been replaced with a redundant address and outputting an activated signal when an access address has been replaced with a redundant address; and
a first logic circuit that outputs an activated output signal if the enable signal and a redundancy selection signal obtained by decoding a prescribed bit field of an access address both are activated;
said semiconductor memory device further comprising:
a second logic circuit that receives as inputs the output signals of said respective first logic circuits of the plurality of redundant addresses, and outputs an activated signal when the plurality of first logic circuits are all inactive;
a third logic circuit that receives as inputs the output signals of said respective determination circuits of the plurality of redundant addresses, and outputs an activated redundant-hit signal when at least one of the output signals is activated; and a selector that receives as inputs the output signals of said second and third logic circuits, and outputs the output signal of said third logic circuit as a test-result mask signal, when the memory array is tested, and outputs the output signal of said second logic circuit as a test-result mask signal when a redundant area is tested;

wherein said second circuit receives as inputs the 1-bit pass/fail signals from said first circuits and the test-result mask signal from said selector and forcibly outputs a value indicative of pass when the test-result mask signal is active.

5. The semiconductor memory device according to claim 4, further comprising a second selector for exercising changeover control in such a manner that if it is determined based upon the result of determination by said determination circuit that the access address has been replaced with a redundant address in normal operation and in testing a memory array, then the redundant cell selected by the redundant address is accessed, and such that in testing the redundant area, accessing of a redundant cell is performed by a redundant address selected by a redundancy selection signal obtained by decoding a prescribed bit field of an access address.

6. A semiconductor memory device,
wherein data is read out of a memory cell and a redundant cell, in which a prescribed potential has been written, and the read-out data is compared with a corresponding expected value to perform a test;
the semiconductor memory device, comprising:
a test circuit that performs a test, providing a test result, by dividing into a memory cell under test and a redundant cell;
wherein said test circuit, upon testing the memory cell, forcibly sets the test result to a value indicative of pass when said test circuit has determined that the memory cell under test has been replaced with a redundant cell, and,
upon testing the redundant cell, forcibly sets the test result to a value indicative of pass when said test circuit has determined that the redundant cell under test has not been used in replacement of a fail cell.

7. A semiconductor memory device comprising:
a first circuit that, upon testing a memory array, reads data out of a memory cell to which write data of value that sets the memory cell to a prescribed potential has been written and compares the read-out data with an expected value including the write data of value that sets the memory cell to the prescribed potential to generate pass or fail as a test result;
a second circuit that, upon testing the memory array, forcibly sets the test result to a value indicative of pass when a memory cell under test has been replaced with a redundant cell from a redundant area;
a circuit that stores, for each of redundant addresses, information indicative of whether or not the redundant address is being used for redundant replacement of a fail cell; and
a circuit which, upon testing the redundant area, exercises control in such a manner that test result is forcibly set to a value indicative of pass when all of the redundant addresses are unused, and such that test result relating to a selected redundant cell is output when a redundant address that is being used has been selected;

wherein the test of the memory array and the test of the redundant area are conducted separately.

8. The semiconductor memory device according to claim 7, wherein after write data of a value that sets a plurality of memory cells under test to the prescribed potential has been written to respective ones of the plurality of memory cells,
said first circuit:
compares, providing a comparison, a plurality of items of read-out data from the plurality of memory cells with corresponding expected values, the corresponding expected values comprising a plurality of items of write data of values that set the plurality of memory cells to the prescribed potential, and
compresses the test result to a 1-bit pass/fail signal based upon whether or not there is a match in a plurality of results of the comparison between the plurality of items of read out data and the corresponding expected values; and
said second circuit forcibly sets the value of the 1-bit pass/fail signal to a value indicative of pass if a memory cell under test has been replaced with the redundant cell.

9. The semiconductor memory device according to claim 7, wherein in normal operation and in testing the memory array,
if it is determined that the access address has been replaced with the redundant address, a redundant cell selected by the redundant address is accessed,
while if it is determined that the access address has not been replaced with the redundant address, a normal cell is accessed by the access address; and
in testing the redundant area, accessing of a redundant cell is performed by a redundant address selected by a redundancy selection signal obtained by decoding a prescribed bit field of an access address.

10. The semiconductor memory device according to claim 7, wherein in testing the redundant area, after each item of write data of a value that sets a plurality of redundant cells to the prescribed potential has been written,
read-out data from the plurality of redundant cells and expected values, the expected values comprising a plurality of items of write data that set the plurality of redundant cells to the prescribed potential are compared providing a comparison, and the test result is output upon being compressed to a 1-bit pass/fail signal based upon whether or not there is a match in a plurality of results of the comparison the read-out data from the plurality of redundant cells and the expected values.

11. A semiconductor memory device, wherein when a memory array is tested, write data of value that sets a plurality of memory cells under test to a prescribed potential in common is written to respective ones of the plurality of memory cells,
said device comprising:
a first circuit that compares in parallel a plurality of items of read-out data from the plurality of memory cells under test and expected values comprising a plurality of items of write data that set the plurality of memory cells to the prescribed potential to provide a test result, and outputs the test result upon compressing it to a 1-bit pass/fail signal based upon whether or not there is a match in a plurality of results of comparison relating to the plurality of memory cells;
a second circuit that, in testing the memory array, forcibly sets the test result relating a memory cell of the plurality of memory cells under test to a value indicative of pass if the memory cell of the plurality of memory cells under test has been replaced with a redundant cell from a redundant area; and a circuit which, in testing the redundant area, exercises control in such a manner that test result is forcibly set to a value indicative of pass if all of the redundant addresses are unused, and such that test result relating to a selected redundant cell is output if a redundant address that is being used has been selected;

wherein the test of the memory array and the test of the redundant area are conducted separately.

12. The semiconductor memory device according to claim 11, further comprising:

a plurality of determination circuits provided in correspondence with redundant addresses, respectively, each of which determines whether or not an access address has been replaced with a redundant address and outputs an activated signal when an access address has been replaced with a redundant address; and a logic circuit that receives outputs of said determination circuits of respective ones of the plurality of redundant addresses, and activates and outputs a test-result mask signal, when at least one output is activated;

wherein said second circuit receives the test result and the test-result mask signal as inputs and forcibly sets the test result to a value indicative of pass when at least one of the outputs is activated.

13. The semiconductor memory device according to claim 12, the redundant address corresponds to a redundant column and/or a redundant row.

14. The semiconductor memory device according to claim 11, further comprising the following in correspondence with each redundant address:

a storage unit that stores, as an enable signal, information indicating whether the redundant address is being used in redundant replacement of a fail cell;

a determination circuit that determines whether or not an access address has been replaced with a redundant address and outputting an activated signal when an access address has been replaced with a redundant address; and a first logic circuit that outputs an activated output signal if the enable signal and a redundancy selection signal obtained by decoding a prescribed bit field of an access address both are activated;

said semiconductor memory device further comprising:

a second logic circuit that receives as inputs the output signals of said respective first logic circuits of the plurality of redundant addresses, and outputs an activated signal when the plurality of first logic circuits are all inactive;

a third logic circuit that receives as inputs the output signals of said respective determination circuits of the plurality of redundant addresses, and outputs an activated redundant-hit signal when at least one of the output signals is activated; and a selector that receives as inputs the output signals of said second and third logic circuits, and outputs the output signal of said third logic circuit as a test-result mask signal, when the memory array is tested, and outputs the output signal of said second logic circuit as a test-result mask signal when the redundant area is tested;

wherein said second circuit receives as inputs the 1-bit pass/fail signals from said first circuits and the test-result mask signal from said selector and forcibly outputs a value indicative of pass when the test-result mask signal is active.

15. The semiconductor memory device according to claim 14, further comprising a second selector for exercising changeover control in such a manner that if it is determined based upon the result of determination by said determination circuit that the access address has been replaced with a redundant address in normal operation and in testing a memory array, then the redundant cell selected by the redundant address is accessed; and such that in testing the redundant area, accessing of a redundant cell is performed by a redundant address selected by a redundancy selection signal obtained by decoding a prescribed bit field of an access address.

16. A method of testing a semiconductor memory device, comprising:

reading data out of a memory cell under test to which write data of value that sets the memory cell to a prescribed potential has been written and comparing the read-out data with a corresponding expected value to generate a test result;

forcibly setting the test result to a value indicative of pass if it is determined that the memory cell under test has been replaced with a redundant cell;

reading data out of a redundant cell to which write data of value that sets the memory cell to a prescribed potential has been written and comparing the read-out data with a corresponding expected value to generate a second test result; and forcibly setting the second test result to a value indicative of pass if it is determined that the redundant cell has not been used in redundant replacement of a fail cell.

17. A method of testing a semiconductor memory device, comprising:

writing data of a value that sets a plurality of memory cells under test to a prescribed potential common to respective ones of the plurality of memory cells, when a memory array is tested; and comparing, to provide a test result, in parallel a plurality of items of read-out data from the plurality of memory cells and an expected value comprising a plurality of items of write data of value that sets the plurality of memory cells to the prescribed potential, and outputting the test result upon compressing it to a 1-bit pass/fail signal based upon whether or not there is a match in a plurality of results of comparison relating to the plurality of memory cells;

forcibly setting, in testing the memory array, the test result relating a memory cell of the plurality of memory cells under test to a value indicative of pass when the memory cell of the plurality of memory cells under test has been replaced with a redundant cell from a redundant area; and exercising, in testing the redundant area, control in such a manner that test result is forcibly set to a value indicative of pass when all of the redundant addresses are unused, and such that test result relating to a selected redundant cell is output if a redundant address that is being used has been selected;

wherein the test of the memory array and the test of the redundant area are conducted separately.

* * * * *